(12) United States Patent
Farassat

(10) Patent No.: US 7,458,496 B2
(45) Date of Patent: Dec. 2, 2008

(54) WIRE BONDER AND METHOD OF OPERATING THE SAME

(75) Inventor: Farhad Farassat, Taufkirchen (DE)

(73) Assignee: F&K Delvotec Bondtechnik GmbH, Ottobrunn (DE)

( * ) Notice: Subject to any disclaimer, the term of this patent is extended or adjusted under 35 U.S.C. 154(b) by 0 days.

(21) Appl. No.: 11/200,868

(22) Filed: Aug. 10, 2005

(65) Prior Publication Data

US 2006/0071049 A1 Apr. 6, 2006

(30) Foreign Application Priority Data

Aug. 11, 2004 (EP) .................... 04019097

(51) Int. Cl.
*B23K 37/00* (2006.01)
*B23K 31/02* (2006.01)

(52) U.S. Cl. ............... 228/4.5; 228/9; 228/103; 228/180.5

(58) Field of Classification Search ............ 228/4.5, 228/180.5, 110.1, 1.1
See application file for complete search history.

(56) References Cited

U.S. PATENT DOCUMENTS

| 4,878,609 | A | * | 11/1989 | Farassat | 228/4.5 |
| 4,976,392 | A | * | 12/1990 | Smith et al. | 228/102 |
| 5,314,105 | A | * | 5/1994 | Farassat | 228/102 |
| 5,456,403 | A | * | 10/1995 | Nishimaki et al. | 228/102 |
| 5,458,280 | A | * | 10/1995 | Nishimaki et al. | 228/102 |
| 5,474,224 | A | * | 12/1995 | Nishimaki et al. | 228/102 |
| 5,566,876 | A | * | 10/1996 | Nishimaki et al. | 228/102 |
| 5,702,049 | A | * | 12/1997 | Biggs et al. | 228/105 |
| 5,870,489 | A | * | 2/1999 | Yamazaki et al. | 382/151 |
| 6,449,516 | B1 | | 9/2002 | Kyomasu et al. | |
| 6,467,673 | B2 | * | 10/2002 | Enokido et al. | 228/105 |
| 6,516,990 | B2 | * | 2/2003 | Hess et al. | 228/4.5 |
| 6,945,446 | B2 | * | 9/2005 | Hayata | 228/103 |
| 2001/0016062 | A1 | | 8/2001 | Enokido et al. | |
| 2003/0098426 | A1 | | 5/2003 | Hayata | |
| 2006/0157537 | A1 | * | 7/2006 | Walther | 228/102 |

FOREIGN PATENT DOCUMENTS

| DE | 43 35 468 A1 | * | 10/1993 |
| DE | 4239039 A1 | * | 5/1994 |
| EP | 0 649 701 A1 | | 10/1994 |
| EP | 1 352 701 A | | 10/2003 |
| JP | 55120144 A | * | 9/1980 |
| JP | 04256550 | | 9/1992 |
| WO | WO 2005/028150 A1 | * | 3/2005 |

* cited by examiner

*Primary Examiner*—Kiley Stoner
(74) *Attorney, Agent, or Firm*—Knobbe Martens Olson & Bear LLP

(57) ABSTRACT

Wire bonder having a bonding head which has a bonding tool and a bonding wire guide and, especially, a bonding wire cutting device which comprises a cutter for separation of that section of a bonding wire which projects beyond a bonding contact, the wire bonder having a camera with a downstream image processing device for recording and processing an image of its working region at a workpiece.

6 Claims, 3 Drawing Sheets

WIRE BONDER AND METHOD OF OPERATING THE SAME

The invention relates to a wire bonder according to the preamble of Claim 1 and to a method of operating the same. Wire bonders of such a kind are known; in respect of the actual work phase and work procedures of such a wire bonder reference is made, for example, to EP 0 649 701 B1 of the Applicant. In particular, a bonding wire cutting device of a wire bonder of such a kind is described in EP 1 352 701 A1 of the Applicant.

Such wire bonders carry out, at a high speed, a work procedure wherein a plurality of sensitive parts have to be brought into exact positional relationships with respect to one another and held for a predetermined time and using a predetermined contact force. Faultless operation of such devices, which results in qualitatively flawless bond connections, accordingly requires precise setting of the positional and angular relationships of the basic components, namely especially the bonding tool, the bonding wire guide and, where present, the cutter of an integral bonding wire cutting device. Because, moreover, the positional and angular relationships of those device components can gradually change in long-term operation, there is a certain risk, even in the case of flawless initial setting, of incorrect settings later and of resulting quality shortcomings in the production process. In addition, damage to the mentioned components can occur, for example deformation of the die, breakage or twisting of the cutter or slot-shaped widening of the interior space of the bonding wire guide.

In order to prevent quality shortcomings of such a kind with a high degree of reliability it is accordingly customary in practice for highly qualified specialists, besides carrying out the initial setting, also to perform checks at particular intervals on the positional and angular relationships and on the undamaged nature of the mentioned components of a bonding device. That practice is relatively time-consuming and costly and naturally involves undesirable interruptions in the production process.

The invention is therefore based on the problem of providing an improved wire bonder of the same generic kind and an improved method of operation, by means of which it is possible to achieve a high level of quality assurance in the bonding process with a low maintenance requirement and a low cost outlay.

The problem is solved, in its apparatus aspect, by a wire bonder having the features of Claim 1 and, in its method aspect, by a method having the features of Claim 7. Advantageous developments of the concept of the invention form the subject-matter of the dependent claims.

The invention includes the basic concept of associating, with a camera provided at the wire bonder and having a downstream image processing device, storage and processing means for using recorded images for checking the spatial positions or positional relationships of basic work devices of the bonder. It further includes the concept of providing in the image processing device storage means for storing corresponding desired data and/or desired images of previously determined positions of the bonding tool and/or bonding wire guide and/or, as appropriate, of the cutter or of a projecting bonding wire tail of a bonding wire cutting device. Alternatively or additionally, storage means are provided for storage of positional relationships between the mentioned components or between one or more of those components and a substrate surface.

The invention further includes the concept of providing comparator means for comparing the mentioned desired data or desired images with actual positional data or actual images of the corresponding components or of the bonding wire tail, which means in the event of detection of a significant discrepancy between desired data and positional data or desired images and actual images output a control or warning signal. Those comparator means are operated using a suitable control in order to carry out checking of the positions or positional relationships at least at regular intervals but also, where necessary, continuously during a bonding process and to detect impermissible discrepancies with sufficient speed.

By means of the mentioned output signal it is possible, in a relatively simple embodiment of the invention, for an alarm to be given and for qualified operating personnel to be caused to intervene. Such intervention is especially necessary when damage to the relevant tools is detected, which could result in (especially hidden) quality defects in the bonding process, and therefore requires the tool in question to be replaced. In a relatively sophisticated embodiment of the invention, the comparator means output sufficiently differentiated control signals, the character of which represents at least to a certain degree the nature of the discrepancy of the actual positional data and which trigger automatic or interactively controlled correction of the position of the component(s) concerned.

In a preferred embodiment of the proposed wire bonder, there are provided at least a first, second and third storage region for storing desired data and/or desired images of the bonding tool, of the bonding wire guide and of the cutter, and the comparator means comprise a first, second and third comparator unit for comparing the desired data (or desired images) stored in the first to third region with actual positional data and/or images of the corresponding components. An embodiment can also be advantageous wherein in particular storage regions there are stored data sets (for example, relating to a desired tool position) and in others there are stored images (for example, relating to the desired contour of an undamaged tool), as the basis for comparative processing with actually recorded data and images, respectively.

Finally there is provided in that case a logic processing unit for linking output signals—which primarily are present separately—of the comparator units, which logic processing unit outputs the mentioned control/warning signal when a predetermined combination of output signals of the first to third comparator units is present. In the case of this embodiment it is advantageously possible, by means of suitable threshold value processing in conjunction with downstream logic processing, for "non-damaging" changes in the absolute position of particular components of the wire bonder to be left without effect whereas especially critical changes in positional coordinates of the mentioned tools (or between one or more of those tools and the bonding substrate) trigger a shutdown or automatic correction procedure.

In a further advantageous embodiment, the storage means are arranged for the storage of, in each case, a plurality of sets of desired data or a plurality of desired images of the bonding tool and/or of the bonding wire guide and/or of the cutter in permissible operational positions and the comparator means are arranged for the comparative processing of the plurality of desired data sets or desired images with an actual data set or actual image in accordance with a predetermined comparison algorithm. The mentioned comparison algorithm is so arranged that the mentioned control and/or warning signal is output when a predetermined set of discrepancies is present between desired data and positional data and/or desired images and actual images.

In that embodiment of the invention, in the bonding process to a certain extent a previously stored set of permissible spatial positions of the relevant tools/components or of positional relationships between them or between one or more of them and the substrate is therefore compared sequentially with the corresponding actual state. If a sufficient degree of non-conformity is found, the alarm or correction procedure is triggered.

Of particular relevance are height values and inclination values of the bonding tool, of the bonding wire guide and/or of the cutter in space (in the form of absolute values and/or spacing values and angular differences between at least two of those components and/or at least one of those components and the substrate surface). Accordingly, such data are preferably stored as desired data and determined by suitable positional data computation means from the output signals of the image processing unit, and the desired and actual data corresponding to one another are then subjected to the above-mentioned comparison. Also relevant are complete representations or contours of the wedge, of the bonding wire guide and/or of the cutter or also of the bonding wire tail, in order to be able to detect damage occurring during operation of the wire bonder or impermissible wear on those parts and to generate an alarm signal for replacement.

In addition to the above-mentioned correction of positional parameters and/or positional relationships of the tool components there also come into consideration other corrections in the course of the bonding process for the compensation of positional changes, for example in the setting of the bonding force. These can be combined with a partial resetting of the position or positional relationships, up to a certain extent however replacing the latter.

Advantages and useful properties of the invention are otherwise to be found in the following description of preferred examples and aspects of embodiments with reference to the Figures, wherein FIG. 1 is a side view of an embodiment of an apparatus for wire bonding (a wire bonder);

Figure 1:
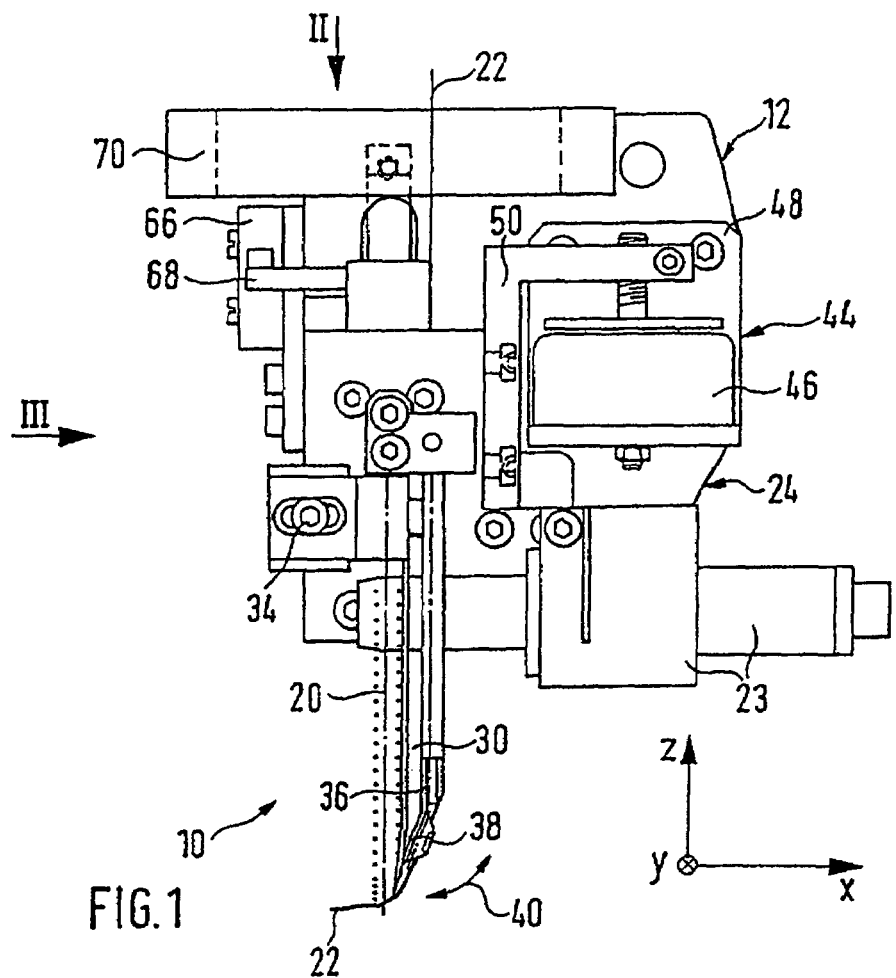
Figure 2:
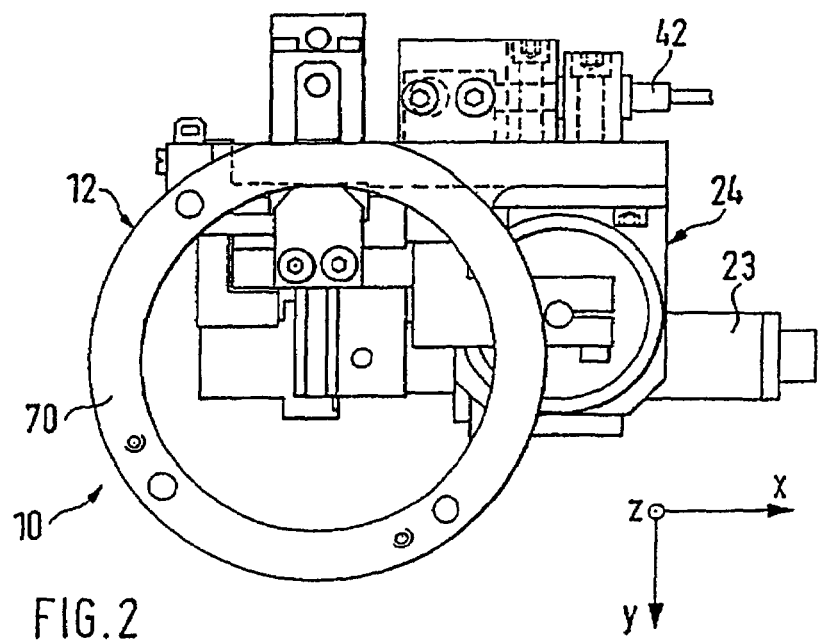
FIG. 2 is a top view of the embodiment of an apparatus in accordance with FIG. 1 according to arrow II.
Figure 3:
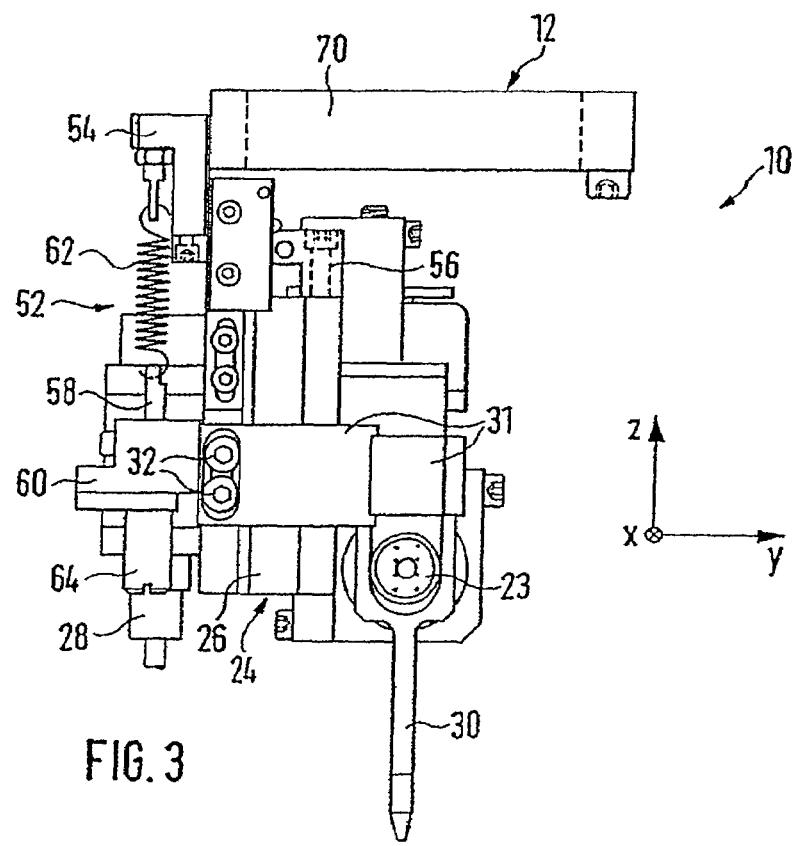
FIG. 3 is a front view of the embodiment of an apparatus in accordance with FIG. 1 according to arrow III.

The apparatus 10 for wire bonding shown in FIGS. 1 to 3 comprises a bonding head 12, which, by means of a drive (not shown), is movable up and down in a direction perpendicular to a contact surface 14, 16 (cf. FIG. 4) corresponding to the z axis. The contact surface 14, 16 is located on a support 18 (cf. FIG. 4), which is movable in an approximately transverse direction to the z axis 74 of the bonding head 12, in the process of which the contact surface 14, 16 is positioned relative to the bonding head 12. In addition, the apparatus 10 for wire bonding according to the invention comprises a device (also not shown) for controlling the drive bonding head 12.

The bonding head 12 comprises a die (wedge) 20, which presses a bonding wire 22 against the contact surface 14, 16 and which can be energised with ultrasound by means of a transducer 23. The die 20 itself is mounted on the bonding head 12 so as to be linearly displaceable parallel to the direction of movement of the bonding head 12, that is to say in the direction of the z axis.

For that purpose, the die 20 is attached to a guide block 24, which is accommodated on the bonding head 12 so as to be linearly displaceable parallel to the direction of movement of the bonding head 12, that is to say in the direction of the z axis. The guide block 24 for the die 20 is displaceably mounted on the bonding head by means of a precision linear guide means 26. As a result, a high degree of dimensional accuracy and security against breaking is ensured.

The bonding head 12 is furthermore provided, for determining or ascertaining the so-called "touch-down" height, with a sensor 28, which is associated with the die 20. The sensor 28 is coupled to the drive for the bonding head 12 by way of the device for the control thereof.

Also attached to the bonding head 12 is a cutter 30, which is associated with the die 20 for, especially partial, separation of the wire 22. When the bonding wire 22 is a thin wire of gold or the like, it is possible to dispense with a cutter 30 of such a kind. The cutter 30 is primarily used, therefore, in the bonding of thick wire.

On the one hand, the cutter 30 is attached to the bonding head 12 by means of a cutter holder 31 using screws, in this instance hexagon socket screws 32, so as to be adjustable in the direction of movement of the bonding head 12 or, that is to say, in the direction of the z axis. On the other hand, however, the cutter 30 is also attached to the bonding head 12 so as to be adjustable in a direction perpendicular to the z axis (the x axis), more particularly in this instance by means of a screw, namely a hexagon socket screw 34. As a result, the cutter 30 can be so arranged in relation to the die 20 that the cutter 30 acts on the wire 22 in a direction that is behind or—as shown in FIGS. 1 to 3—in front of the die 20 in the wire feed direction. The cutter 30 shown in FIGS. 1 to 3 is arranged between, on the one hand, the die 20 and, on the other hand, a wire guide tube 36 (capillary) extending parallel to the die 20.

The wire guide tube 36 is attached to the guide block 24 and is consequently movable along with the die 20. As can be clearly seen from FIG. 1, at the lower free end of the guide tube 36 there is provided a guide sleeve 38 for orienting the wire 22 towards the lower free end or the contact surface of the die 20. The guide sleeve 38 is in the form of a capillary tube and in the present instance is in resilient articulated connection with the guide tube. The guide sleeve 38 is, in that respect, attached to the guide tube 36 so that it can pivot in accordance with the double-headed arrow 40 in FIG. 1, with the result that, when the wire is being cut through, the guide sleeve 38 can be moved out of the movement path of the cutter 30 by the latter and, after the separation procedure is complete, it moves back automatically into the movement path of the cutter, resiliently resting against the latter. The guide tube 36 itself is, in like manner to the cutter 30, attached to the bonding head by means of screws so as to be adjustable in a direction perpendicular to the z axis, that is to say in the direction of the x axis.

In addition, a sensor 42 is associated with the cutter 30 for setting the maximum cutter stroke in the direction of movement of the bonding head 12. By means of the sensor 42 it is possible reliably to avoid undesired separation or possibly complete separation of the wire 22 by the cutter 30 and also undesired penetration of the cutter 30 into the substrate or into electrical or electronic components.

Between the bonding head 12 and the guide block 24 there is furthermore arranged a device 44 for setting and modifying the so-called "bonding weight", that is to say the "weight" to be applied to the wire 22 by the die 20 during bonding. The weight-setting device 44 comprises a magnetic field generating arrangement 46, 48, 50, which produces, between the bonding head 12 and the guide block 24, a magnetic flux which is adjustable and which acts approximately parallel to the direction of movement of the bonding head 12 or to the z direction. For that purpose, the mentioned arrangement comprises, on the one hand, a lifting magnet 46 fixedly connected to the guide block 24 and, on the other hand, an armature 50 fixedly connected to the bonding head 12 by way of an angle member 48.

Arranged between the bonding head 12 and the guide block 24 for the die 20 is a device 52 for application of a force which acts against the action of the weight-setting device 44 in the direction of the z axis. The force application device 52 comprises, on the one hand, an accommodating element 54, which is fixedly connected, by way of an accommodating angle member 56, to the displaceably mounted guide block 24, and a holding element 58, which is attached to the bonding head 12 by way of a mounting block 60 or the like. Arranged between the holding element 58 connected to the bonding head 12 and the accommodating element 54 mounted on the guide block 24 is a tension spring 62, the tensile force of which is adjustable by means of an adjustment screw 64 connected to the holding element 58.

The force application device 52 is furthermore provided with a microswitch 66, which is provided for limiting the relative movement between the bonding head 12 and the guide block 24 for the die 20. In accordance with FIG. 1, the microswitch 66 is actuatable by means of a cylindrical pin 68, which is fixedly connected to the guide block 24 by way of the accommodating angle member 56.

In order to attach the bonding head 12 to its drive (not shown) in any desired orientation about its z axis in a plane parallel to the support 18 and generated by the x axis and y axis, the bonding head 12 is additionally provided with a rotary frame 70. Screws or like attaching means (not shown in detail) then fix the rotary frame 70 to the drive of the bonding head 12.

Figure 4:
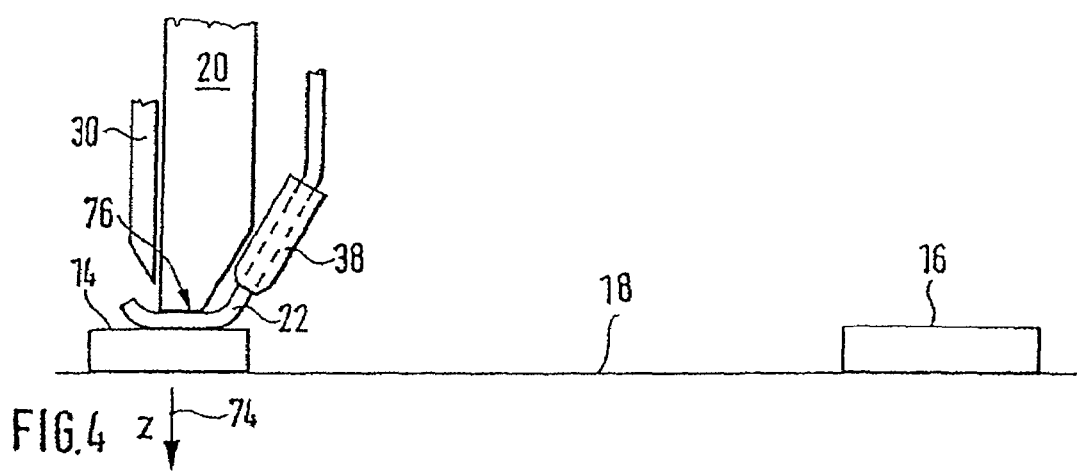
FIG. 4 shows the starting phase of a method procedure of a known wire bonding method.

Using that apparatus, a method of wire bonding is carried out, the starting phase of which is shown in diagrammatic manner in FIG. 4. In the process, the wire is, in a manner not shown in detail, taken up by the bonding head 12 or, if of sufficiently high rigidity, is pushed through the wire guide tube 36. The method procedure is then performed using an apparatus wherein the wire cutter 30 is attached to the bonding head 12 behind the die 20 in the wire feed direction.

The procedure is known per se—for example, from EP 0 649 701 B1 of the Applicant—and its further steps are therefore not explained herein. FIG. 4 shows the so-called "touchdown" of the die 20 arranged on the bonding head 12 and energised with ultrasound, in the process of which a first bond 76 is formed. For that purpose, the die 20 extends further than the cutter 30 and the guide tube or guide sleeve 38, so that the cutter 30 is not yet acting on the wire.

Figure 5:
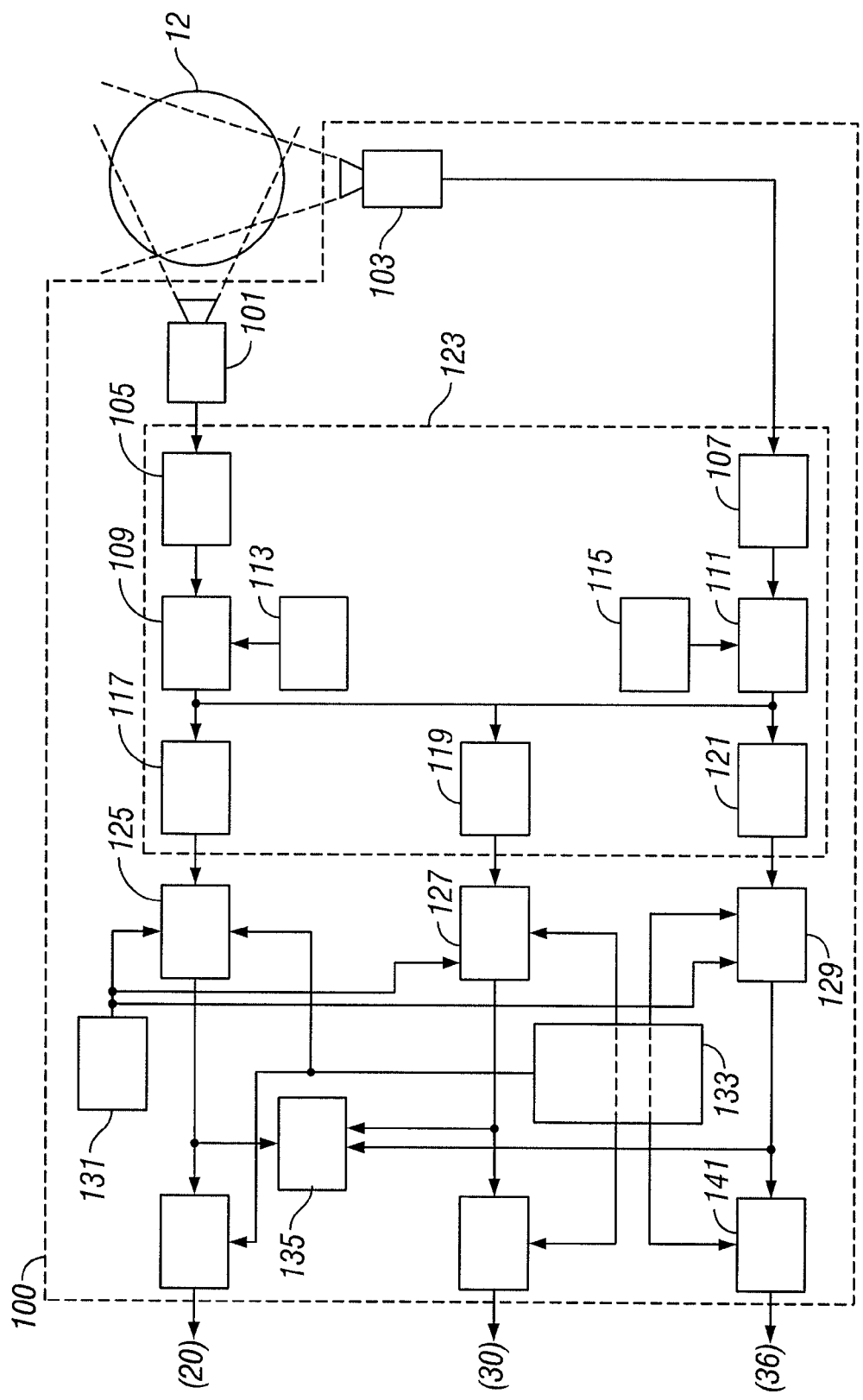
FIG. 5 shows, in diagrammatic manner, an example of an embodiment of the invention.

FIG. 5 shows, in the diagrammatic form of a function block diagram, a monitoring and control arrangement 100 for the monitoring and automatic re-adjustment of the spatial positions of the above-mentioned basic tool components of the bonding head 12 (shown in FIG. 5 only in symbolic form), namely the die or bonding wedge 20, the cutter 30 and the wire guide tube 36 (none of which are shown individually in FIG. 5).

The monitoring and control arrangement 100 comprises two cameras 101, 103, which cover the working range of the bonding head 12 from different points (in the illustration given by way of example, from directions that are perpendicular to one another), together with, in each case, a downstream primary image processing device 105 and 107, respectively, and a pattern recognition device 109 and 111, respectively, having an associated component pattern storage means 113 and 115, respectively. Those image processing components first carry out image processing as understood by customary techniques, for example clearance of interference by means of filtering, edge emphasis etc. in the units 105, 107, and pattern recognition of the relevant tools of the bonding head in the units 109, 111 using contour patterns of the components used in the bonding head 12, namely the die, cutter and bonding wire guide, which contour patterns have been previously stored in the storage means 113, 115.

The outputs of the pattern recognition units 109, 111 are connected to three positional data computation units 117, 119 and 121 for computation of the positional data of the die, the cutter and the bonding wire guide, respectively. The units 105 to 121 in the association described herein form an image processing device 123 whose structure and mode of operation is in principle known to the skilled person, irrespective of the specific nature of the image processing function in this instance, and therefore does not require more detailed description.

The positional data computation unit 117 responsible for the die (wedge) is connected, on the output side, to a first comparator unit 125, the positional data computation unit 119 responsible for the cutter is connected to a second comparator unit 127, and the positional data computation unit 121 provided for computation of the position of the bonding wire guide is connected to a third comparator unit 129 on the input side. The comparator units 125, 127 and 129 are further connected, in respect of control, to a comparison control 131, which controls the monitoring operation of the overall arrangement 100.

The first to third comparator units 125 to 129 are connected, by way of further signal inputs, to a first to third (not separately identified) storage region of a desired data storage means 133, wherein desired positional data sets of the die, the cutter and the bonding wire guide are stored as a comparison basis for comparative processing in the units 125, 127 and 129. The comparator units are, in accordance with the technical possibilities of today, in the form of an intelligent comparative processing means taking into account, in each case, a plurality of previously stored desired data sets and predetermined tolerances of the spatial positions of the relevant tools. Such components are commercially available, and their programming using prespecified position and tolerance relations of the relevant tools of a wire bonder lies within the scope of the skilled person's activity.

On the output side, the first to third comparator units 125 to 129 are connected, on the one hand, to an alarm control unit 135 and, on the other hand, to a first to third position setting unit 137, 139 and 141, respectively. The output signals of the comparator units are accordingly used, on the one hand, for the outputting of alarm signals in the event of relevant misadjustment of the bonding head components and, on the other hand, for the readjustment thereof, it being possible for both response possibilities to be activated individually or in combination with one another. The position setting units 137, 139 and 141 are also connected to the corresponding storage regions of the desired data storage means 133 so that they can receive from the latter desired positional data for the tool in question as a basis for the readjustment to be carried out.

As noted hereinbefore, it is also possible, in response to the detection of incorrect positions of one or more of the relevant tools, besides the outputting of an alarm and readjustment of the position of the component in question, to provide for influencing further parameters of the bonding process; the pictorial representation of that possibility has been omitted, however, in the interest of clarity of the Figure. For the same reason, representation of storage and processing means for the storage and processing of images of the individual tools or of a projecting end of the bonding wire (tail) present in certain steps of the bonding process has been omitted; an arrangement including corresponding components can be created by the skilled person on the basis of the above explanations.

Implementation of the invention is not limited to the above-described exam pie and to the aspects given prominence in this context but is likewise possible in a large number of modifications which are within the scope of the activity of the skilled person. Modifications are possible especially in respect of the nature of image processing in the narrower sense and in respect of the downstream comparative processing, it being possible in particular for comprehensive comparative image processing to replace the above-mentioned comparative processing of actual positional data sets and desired positional data sets.

The invention claimed is:

1. Wire bonder having a bonding head which has a bonding tool and a bonding wire guide and a bonding wire cutting device which comprises a cutter for separation of that section of a bonding wire which projects beyond a bonding contact, the wire bonder having a camera with a downstream image processing device for recording and processing an image of its working region at a workpiece, wherein with the image processing device there is associated storage for storing data of at least one desired positional relationship between at least two of the bonding tool, the bonding wire guide, and the cutter; and the wire bonder also having a comparison control and comparator connected, on the input side, to the storage, and to the image processing device, for comparing the data with actual images of the corresponding components and for outputting a control or warning signal indicative of a significant discrepancy between desired positional relationships and actual images;

wherein the storage comprises at least a first, second and third storage regions for storing desired data and/or desired images of the bonding tool, of the bonding wire guide and/or of the cutter;

wherein the comparator comprises at least a first, second and third comparator unit for comparing the desired data and/or desired images stored in the first to third storage regions with positional data and/or images of the bonding tool, of the bonding wire guide and of the cutter, and wherein downstream of the first to Third comparator units there is arranged a logic processing unit for linking separate output signals of the comparator units, which is arranged for the outputting of a control and/or warning signal when a predetermined combination of output signals of the first to third comparator units is present.

2. Wire bonder according to claim 1, wherein the storage is arranged for the storage of, in each case, a plurality of sets of desired data or a plurality of desired images of the bonding tool and/or of the bonding wire guide and/or of the cutter in permissible operating positions and/or states, and the comparator is arranged for the comparative processing of the plurality of desired data sets or desired images with, in each ease, a positional data set or image in accordance with a predetermined comparison algorithm which links the outputting of a control and/or warning signal to a predetermined set of discrepancies between desired data and positional data or desired images and images.

3. Wire bonder according to claim 1, wherein stored in the storage as desired data are height values and/or inclination values of the bonding tool and/or of the bonding wire guide and/or of the cutter and/or spacing values and/or angular differences between at least two of those components and/or one thereof and the substrate surface, and the image processing device comprises positional data computation circuits for computation of a positional data set of corresponding actual height values and/or inclination values and/or spacing values and/or angular differences, which are connected on the output side to an input of the comparator means.

4. Wire bonder according to claim 1, wherein the image processing unit and/or the comparator comprise(s) pattern recognition for recognition of an outline of at least one of the components comprising the bonding tool, bonding wire guide and cutter in an actual image for obtaining an actual pattern and a pattern processor for comparative processing of the actual pattern with a desired pattern of the corresponding component(s) which is stored as a desired image in the storage.

5. Wire bonder according to claim 1, wherein there is connected to the output of the comparator a process control unit for controlling at least one parameter of the bonding process.

6. Wire bonder according to claim 1, wherein the data comprises one or more images.

* * * * *

UNITED STATES PATENT AND TRADEMARK OFFICE
CERTIFICATE OF CORRECTION

PATENT NO. : 7,458,496 B2
APPLICATION NO. : 11/200868
DATED : December 2, 2008
INVENTOR(S) : Farhad Farassat It is certified that error appears in the above-identified patent and that said Letters Patent is hereby corrected as shown below:

At Column 3, Line 54, after "drive" please insert --for the--.

At Column 7, Line 4, please delete "examp pie" and insert therefore, --example--.

At Column 7, Line 44, please delete "Third" and insert therefore, --third--.

At Column 8, Line 11, please delete "ease," and insert therefore, --case--.

Signed and Sealed this

Nineteenth Day of January, 2010

David J. Kappos
*Director of the United States Patent and Trademark Office*